United States Patent
Zhao et al.

(10) Patent No.: US 12,046,670 B2
(45) Date of Patent: Jul. 23, 2024

(54) SEMICONDUCTOR DEVICE HAVING A GATE CONTACT OVER AN ACTIVE REGION

(71) Applicant: GLOBALFOUNDRIES U.S. Inc., Malta, NY (US)

(72) Inventors: Zhixing Zhao, Dresden (DE); Manjunatha Prabhu, Halfmoon, NY (US); Shafiullah Syed, Murphy, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 284 days.

(21) Appl. No.: 17/488,235

(22) Filed: Sep. 28, 2021

(65) Prior Publication Data

US 2023/0102787 A1    Mar. 30, 2023

(51) Int. Cl.
*H01L 29/78* (2006.01)
*H01L 29/40* (2006.01)
*H01L 29/417* (2006.01)
*H01L 29/423* (2006.01)

(52) U.S. Cl.
CPC ......... *H01L 29/78* (2013.01); *H01L 29/401* (2013.01); *H01L 29/41775* (2013.01); *H01L 29/4238* (2013.01); *H01L 29/41783* (2013.01)

(58) Field of Classification Search
CPC .......... H01L 29/4238; H01L 29/41775; H01L 29/78; H01L 29/41783
See application file for complete search history.

(56) References Cited

U.S. PATENT DOCUMENTS

| | | | |
|---|---|---|---|
| 6,750,517 B1 * | 6/2004 | Ker | H01L 29/0696 257/357 |
| 9,461,143 B2 | 10/2016 | Pethe et al. | |
| 10,580,705 B2 * | 3/2020 | Blin | H01L 27/1203 |
| 2006/0113533 A1 * | 6/2006 | Tamaki | H01L 27/0211 257/E23.015 |
| 2017/0288015 A1 * | 10/2017 | Smith | H01L 29/4983 |
| 2017/0345914 A1 * | 11/2017 | Smith | H01L 27/092 |
| 2023/0178616 A1 * | 6/2023 | Zhang | H01L 29/401 257/213 |

OTHER PUBLICATIONS

A. Razavieh et al., FinFET with Contact over Active-Gate for 5G Ultra-Wideband Applications, 2020 Symposium on VLSI Technology Digest of Technical Papers, 2020, pp. 1-2, IEEE.

\* cited by examiner

*Primary Examiner* — Joseph C. Nicely
(74) *Attorney, Agent, or Firm* — David Cain

(57) ABSTRACT

A semiconductor device comprising an active region, and a gate having side portions and a middle portion, whereby the middle portion is arranged between the side portions. The side portions and the middle portion of the gate may be arranged over the active region. The middle portion may be horizontally wider than the side portions. A first gate contact may be arranged over the middle portion.

20 Claims, 6 Drawing Sheets

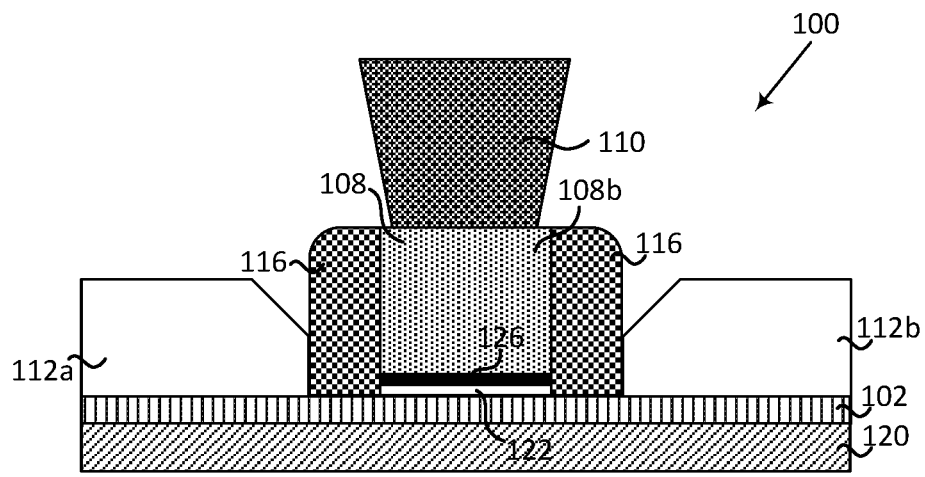
View A-A'  FIG. 2A
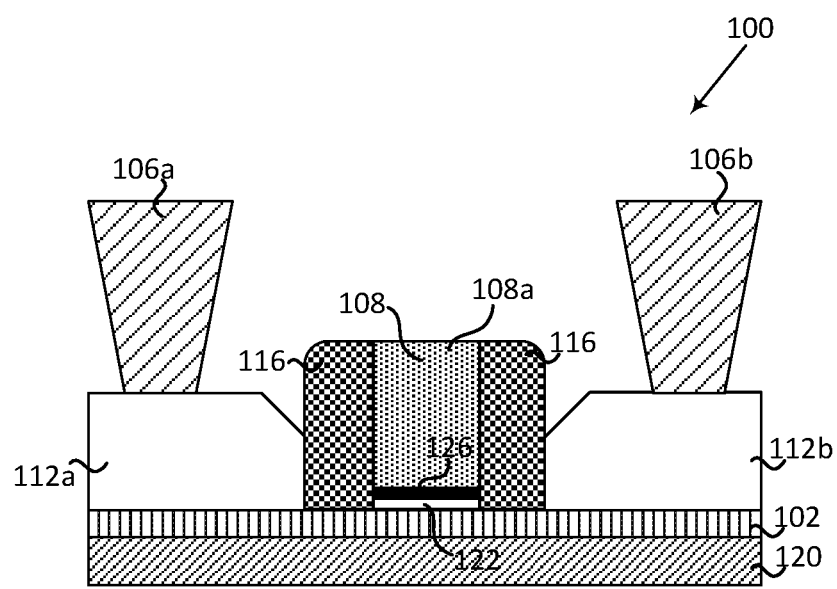
View B-B'  FIG. 2B

View C-C'

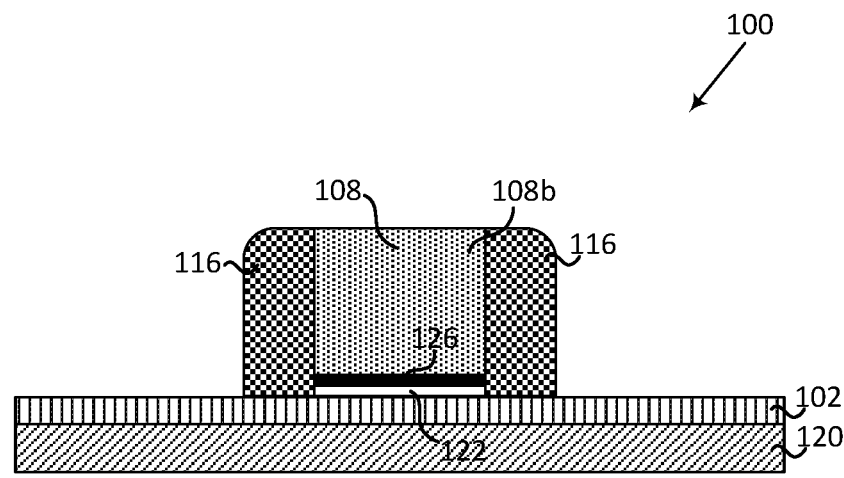
View A-A'                FIG. 6A
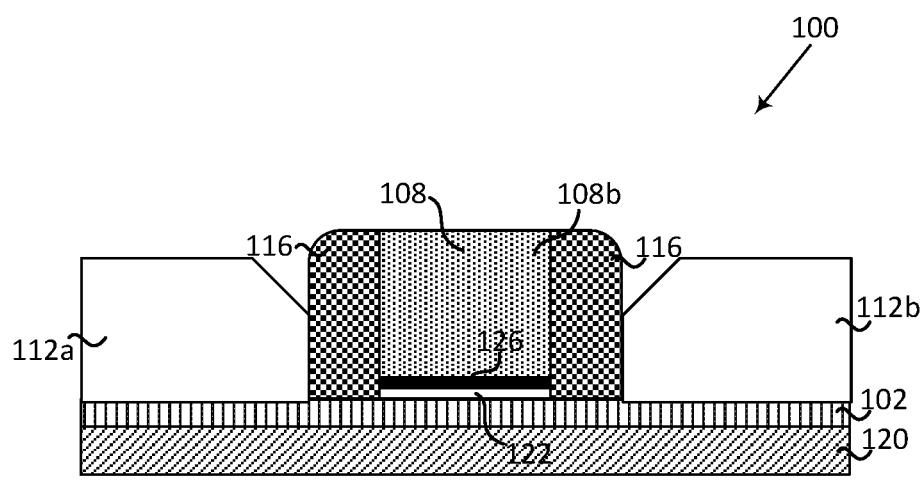
View A-A'                FIG. 6B

SEMICONDUCTOR DEVICE HAVING A GATE CONTACT OVER AN ACTIVE REGION

FIELD OF THE INVENTION

The disclosed embodiments relate generally to semiconductor devices, and more particularly, to semiconductor devices having a gate contact over an active region.

BACKGROUND

For the past few decades, the scaling of features in integrated circuits has been a driving force behind the semiconductor industry. Scaling to smaller features enables increased densities of functional units on the semiconductor chips. For example, scaling leads to increased capacity as a higher number of semiconductor transistors such as memory or logic devices may be incorporated on a chip.

However, the drive for scaling of features in semiconductor transistors has not been without consequence. As the dimensions of these fundamental building blocks of microelectronic circuitry are reduced, numerous process challenges arise. The process limitations of the lithographic processes used for patterning various building blocks have presented significant challenges in fabricating fundamental features for small devices, such as gate contacts. Thus, there is a need to overcome the challenges mentioned above.

SUMMARY

In an aspect of the present disclosure, a semiconductor device is provided. The semiconductor device may comprise an active region and a gate having side portions and a middle portion, whereby the middle portion may be arranged between the side portions. The side portions and the middle portion of the gate may be arranged over the active region. The middle portion may be horizontally wider than the side portions. A first gate contact may be arranged over the middle portion.

In another aspect of the present disclosure, a semiconductor device is provided. The semiconductor device may comprise an active region and a gate having a plurality of side portions and middle portions, whereby the side portions and the middle portions may be arranged over the active region. Each of the middle portions may be arranged between two of the side portions, and the middle portions may be horizontally wider than the side portions. A gate contact may be arranged over each of the middle portions.

In yet another aspect of the present disclosure, a method of fabricating a semiconductor device is provided. The method comprises forming a gate over an active region, the gate having side portions and a middle portion, whereby the side portions and the middle portion may be arranged over the active region. The middle portion may be arranged between the side portions, and the middle portion may be horizontally wider than the side portions. A first gate contact may be formed over the middle portion.

BRIEF DESCRIPTION OF THE DRAWINGS

The disclosed embodiments will be better understood from a reading of the following detailed description, taken in conjunction with the accompanying drawings:

FIG. 2A illustrates a side view of the semiconductor device shown in FIG. 1A taken along section line A-A', according to an embodiment of the disclosure.

FIG. 2B illustrates a side view of the semiconductor device shown in FIG. 1A taken along section line B-B', according to an embodiment of the disclosure.

FIGS. 6A and 6B illustrates a process flow to fabricate the semiconductor device shown in FIG. 1A.

Figure 1A:
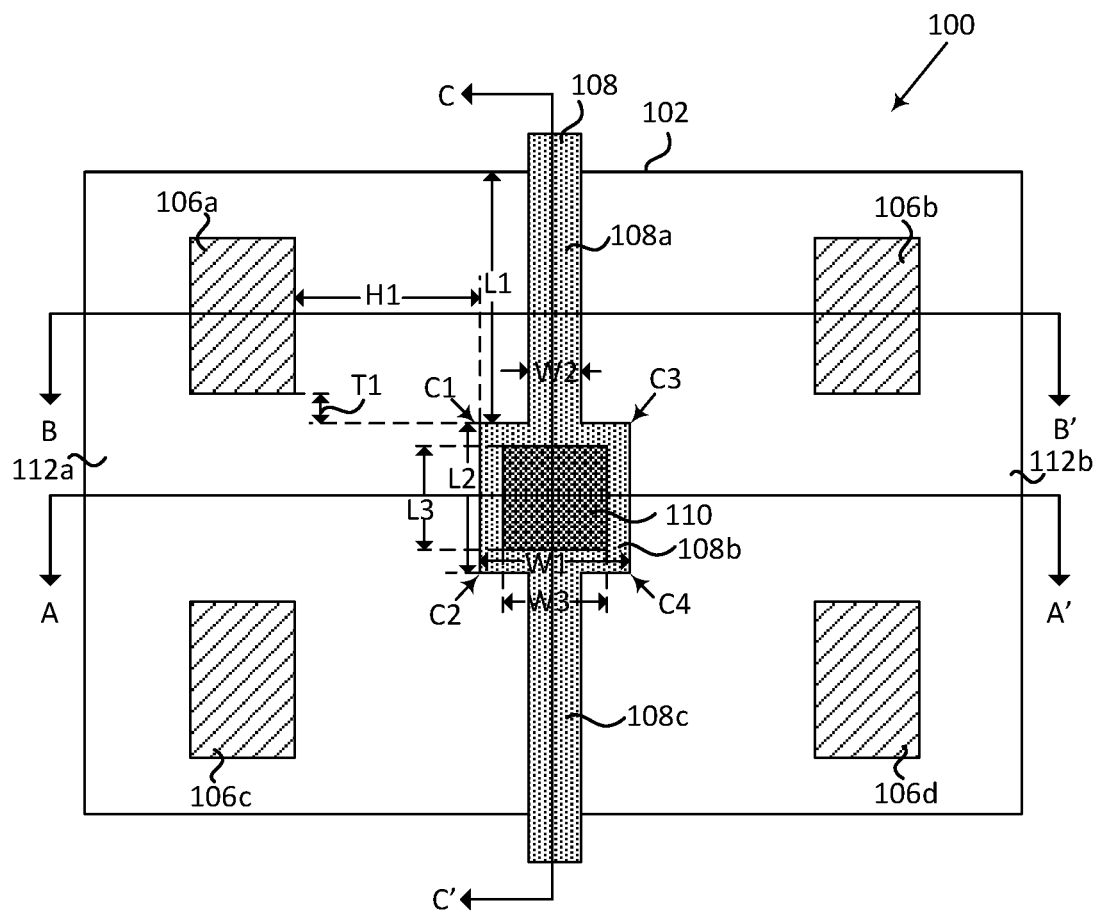
FIG. 1A illustrates a top view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1A illustrates a top view of a semiconductor device 100, according to an embodiment of the disclosure. In one embodiment, the semiconductor device 100 may be a metal oxide semiconductor field effect transistor (MOSFET). Referring to FIG. 1A, the semiconductor device 100 may include a gate 108, a gate contact 110, an active region 102, a source 112a, a drain 112b, source contacts 106a and 106c, and drain contacts 106b and 106d. The source 112a and the drain 112b may be separated by the gate 108. The gate 108 may include a middle portion 108b having a first width W1, and side portions 108a and 108c, each side portion 108a and 108c having a second width W2. The side portions 108a and 108c, and the middle portion 108b may be arranged over the active region 102. The middle portion 108b may be arranged between and connect the side portions 108a and 108c to form a continuous gate structure 108. The first width W1 may be wider than the second width W2. The term "width" may refer to a measurement taken in a horizontal direction. The term "wider" may refer to horizontally wider. For example, in one embodiment, the width W1 of the middle portion 108b may be at least two times wider than the width W2 of the side portion 108a. In a preferred embodiment, the middle portion 108b may be centered between the side portions 108a and 108c or the side portions 108a and 108c may have similar lengths. The performance of the device 100 may be dominated by the narrower features of the side portions 108a and 108c as the middle portion 108b represents a small fraction of the gate 108 length over the active region 102. For example, a length L1 of the side portion 108a over the active region 102 may be at least approximately one point seven (1.7) times a length L2 of the middle portion 108b. The term "length" may refer to a measurement taken in a vertical direction. The term "longer" may refer to vertically longer.

The gate contact 110 having a width W3 may be arranged over the middle portion 108b. The width W3 of the gate contact 110 may be wider than the width W2 of the side portion 108a. The width W1 of the middle portion 108b may be at least one point two (1.2) times wider than the width W3 of the gate contact 110. The length L2 of the middle portion 108b may be approximately one point three (1.3) times longer than a length L3 of the gate contact 110. The source 112a may be arranged over the active region 102, spaced apart from a first side of the gate 108. The drain 112b may be arranged over the active region 102, spaced apart from a second side of the gate 108 opposite to the source 112a. The wider features of the middle portion 108b relative to the side portions 108a and 108b allows placement of the gate contact 110 over the active region 102 and eliminates the risk of shorting to the source 112a and the drain 112b. Placement of the gate contact 110 over the active region 102 improves heat conduction from the active region 102 through the gate contact 110 and to upper metallization layers during the device 100 operation. Additionally, extension of the gate 108 beyond the active region 102 may be minimized, leading to a compact layout and a smaller device 100 footprint. For example, in an alternative embodiment, end segments of the side portions 108a and 108c of the gate 108 may be over the active region 102 instead of extending beyond the active region 102.

Figure 1B:
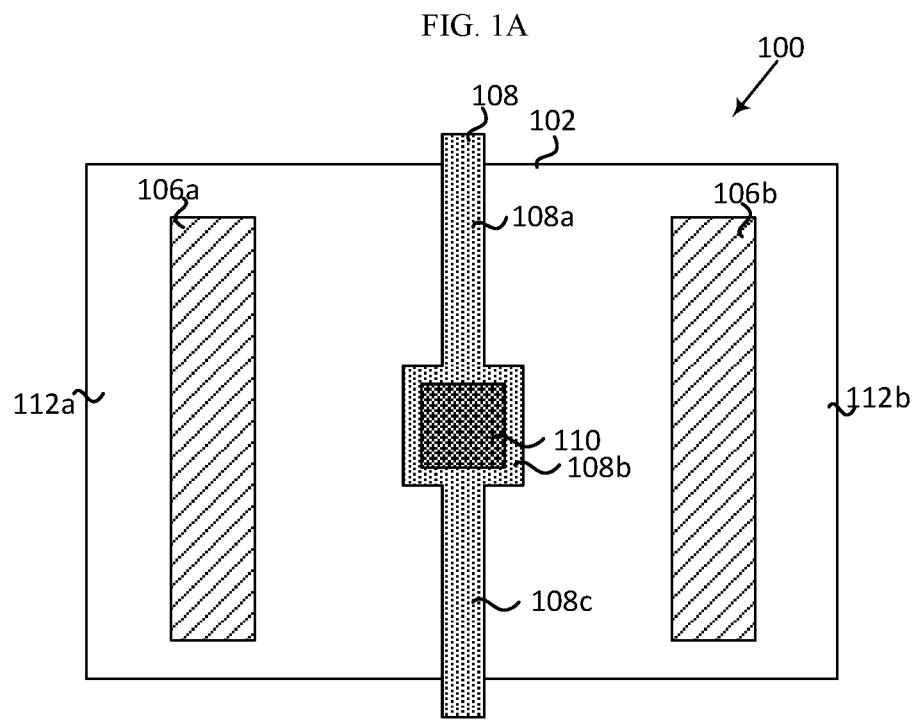
FIG. 1B illustrates a top view of a semiconductor device, according to another embodiment of the disclosure.

The source contacts, 106a and 106c, may be arranged over the source 112a. The source contact 106a may be laterally spaced from the side portion 108a, and diagonally spaced from a corner C1 of the middle portion 108b. For example, the source contact 106a may be horizontally offset from the middle portion 108b by a distance H1 and vertically offset from the middle portion 108b by a distance Ti. The source contact 106c may be laterally spaced from the side portion 108c, and diagonally spaced from a corner C2 of the middle portion 108b, opposite to the source contact 106a. The drain contacts, 106b and 106d, may be arranged over the drain 112b. The drain contact 106b may be laterally spaced from the side portion 108a, and diagonally spaced from a corner C3 of the middle portion 108b. The drain contact 106b may be arranged opposite to the source contact 106a. The drain contact 106d may be laterally spaced from the side portion 108c and diagonally spaced from the middle portion 108b, opposite to the drain contact 106b. The source contacts, 106a and 106c, and the drain contacts, 106b and 106d, may be diagonally spaced from the gate contact 110. The arrangement of the source and drain contacts 106a to 106d relative to the gate contact 110 enables sufficient separation of the source contacts, 106a and 106c, and drain contacts, 106b and 106d, from the gate contact 110 to prevent shorting while maintaining a compact layout. In an alternative embodiment illustrated in FIG. 1B, the drain contact 106b may extend over the drain 112b and may be laterally spaced from a first side of the side portions 108a and 108c, the middle portion 108b and the gate contact 110. Additionally, the source contact 106a may extend over the source 112a and may be laterally spaced from a second side of the side portions 108a and 108c, the middle portion 108b and the gate contact 110, opposite to the drain contact 106b. A larger current readout may therefore be obtained from the source and drain contacts 106a and 106b, respectively.

FIG. 2A illustrates a side view of the semiconductor device 100 shown in FIG. 1A taken along section line A-A', according to an embodiment of the disclosure. Referring to FIG. 2A, the active region 102 may be arranged over a first insulator region 120. The first insulator region 120 may be arranged over a substrate (not shown). The active region 102 may be made of a suitable semiconductor material, for example, silicon, silicon germanium, silicon carbide, gallium nitride, or any other suitable semiconductor material. In one embodiment, the active region 102 may be a planar semiconductor. The first insulator region 120 may be made of silicon dioxide and the substrate may be made of silicon. A gate dielectric layer 122 may be arranged above the active region 102 and a work function metal layer 126 may be arranged over the gate dielectric layer 122. The middle portion 108b may be arranged over the work function metal layer 126. The gate dielectric layer 122 may be made of a suitable dielectric material, for example, silicon dioxide ($SiO_2$), silicon nitride ($Si_3N_4$), a high-k dielectric material, for example, hafnium oxide ($HfO_2$), zirconium oxide ($ZrO_2$), aluminum oxide ($Al_2O_3$), or any other suitable dielectric material. The term "high-k" dielectric material may refer to a dielectric material having a dielectric constant, i.e., k value, of greater than 7. The work function metal layer 126 may be made of titanium nitride (TiN), tantalum nitride (TaN), or any other suitable metal. The gate 108 may be made of n-doped or p-doped polysilicon.

Spacer structures 116 may be arranged adjacent to and in direct contact with the side surfaces of the gate 108. The spacer structures 116 may be made of a suitable dielectric material, for example, silicon dioxide ($SiO_2$), silicon nitride ($Si_3N_4$), silicon oxynitride (SiON), or any other suitable dielectric material. The source 112a may be arranged over the active region 102 and arranged next to a first side of the middle portion 108b. The drain 112b may be arranged over the active region 102 and arranged next to a second side opposite to the first side of the middle portion 108b. For example, the middle portion 108b may be arranged between the source 112a and drain 112b. The source 112a and drain 112b may be spaced from the middle portion 108b. For example, spacer structures 116 may be arranged between the middle portion 108b and the source 112a, and between the middle portion 108b and the drain 112b. The gate contact 110 may be arranged over the middle portion 108b. The spacer structures 116 electrically insulates the gate 108 and the gate contact 110 from the source 112a and the drain 112b. The source 112a and drain 112b may have top surfaces higher than a top surface of the active region 102. Advantageously, the middle portion 108b having a wider width than the width of the gate contact 110 prevents electrical shorting of the gate contact 110 to the source 112a and drain 112b. The source 112a and drain 112b may be made of a suitable semiconductor material, for example, silicon phosphorus (SiP), silicon germanium (SiGe), or any other suitable semiconductor material.

FIG. 2B illustrates a side view of the semiconductor device 100 shown in FIG. 1A taken along section line B-B', according to an embodiment of the disclosure. The source 112a and drain 112b are spaced from and electrically insulated from the gate 108. For example, spacer structures 116 may be arranged at side surfaces of the side portion 108a, electrically insulating the side portion 108a from the source 112a, the source contact 106a, the drain 112b, and the drain contact 106b.

Figure 2C:
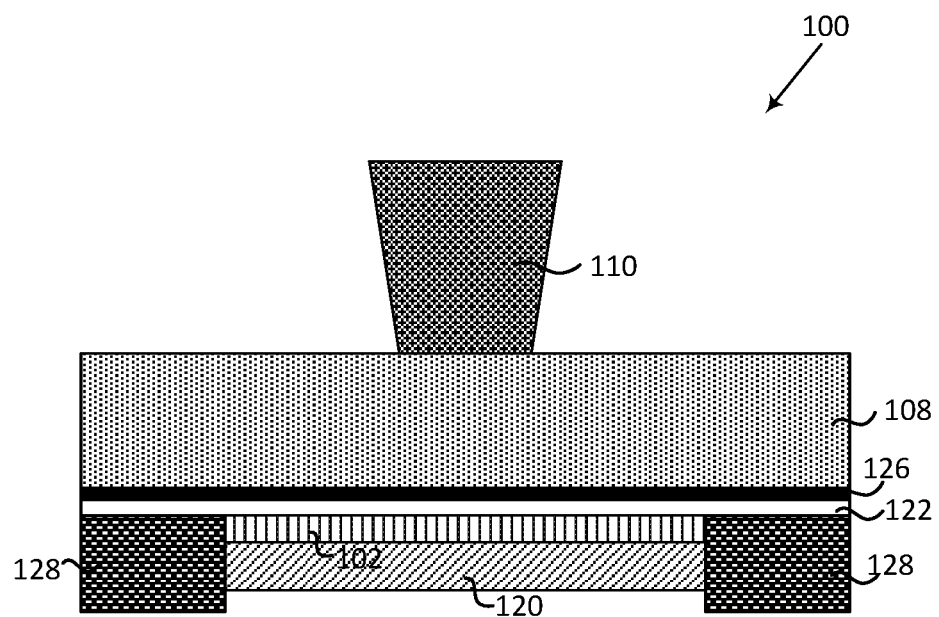
FIG. 2C illustrates a side view of the semiconductor device shown in FIG. 1A taken along section line C-C', according to an embodiment of the disclosure.

FIG. 2C illustrates a side view of the semiconductor device 100 shown in FIG. 1A taken along section line C-C', according to an embodiment of the disclosure. Referring to FIG. 2C, an isolation region 128 may be arranged adjacent to the active region 102. A portion of the gate 108, for example, end segments of the side portions 108a and 108c, may extend beyond the active region 102 and over the isolation region 128. Another part of the side portions 108a and 108c may extend over the active region 102. The isolation region 128 may be made of silicon dioxide.

Figure 3:
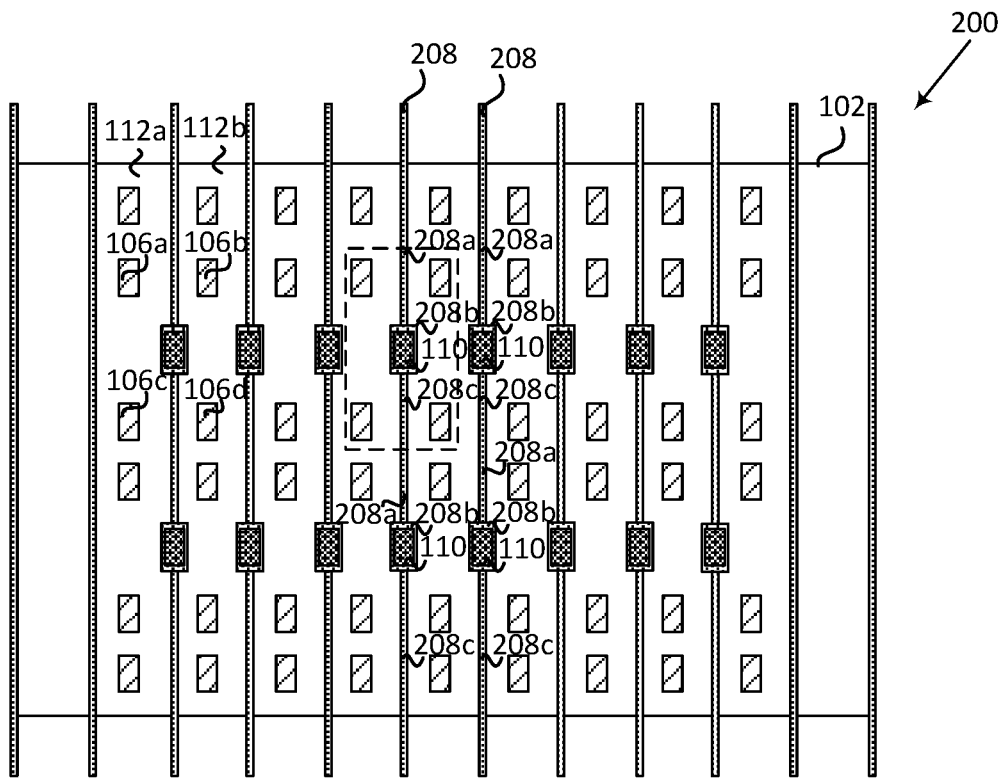
FIG. 3 illustrates a top view of a semiconductor device array, according to another embodiment of the disclosure.

The semiconductor device 100 illustrated in FIG. 1A may be modified to form alternative embodiments without departing from the scope of the disclosure. For example, FIG. 3 illustrates a top view of a semiconductor device array 200, according to another embodiment of the disclosure. Like numerals in FIG. 1A represent like features in FIG. 3. In contrast to the semiconductor device 100, the semiconductor device 200 may include an array of gates 208, each gate 208 having a plurality of side portions 208a and 208c, and at least two middle portions 208b arranged over an active region 102. For clarity, a unit cell of the gate 208 is encircled by dashed lines. Each of the middle portions 208b may be arranged between the side portions 208a and 208c. The middle portions 208b may be wider than the side portions 208a and 208c. Gate contacts 110 may be arranged over the middle portions 208b. The gate contacts 110 may be wider than the side portions 208a and 208c. The middle portions 208b may be wider than the gate contacts 110. The semiconductor device 200 presents a low gate resistance as there are at least two middle portions 208b for each gate 208.

Figure 4:
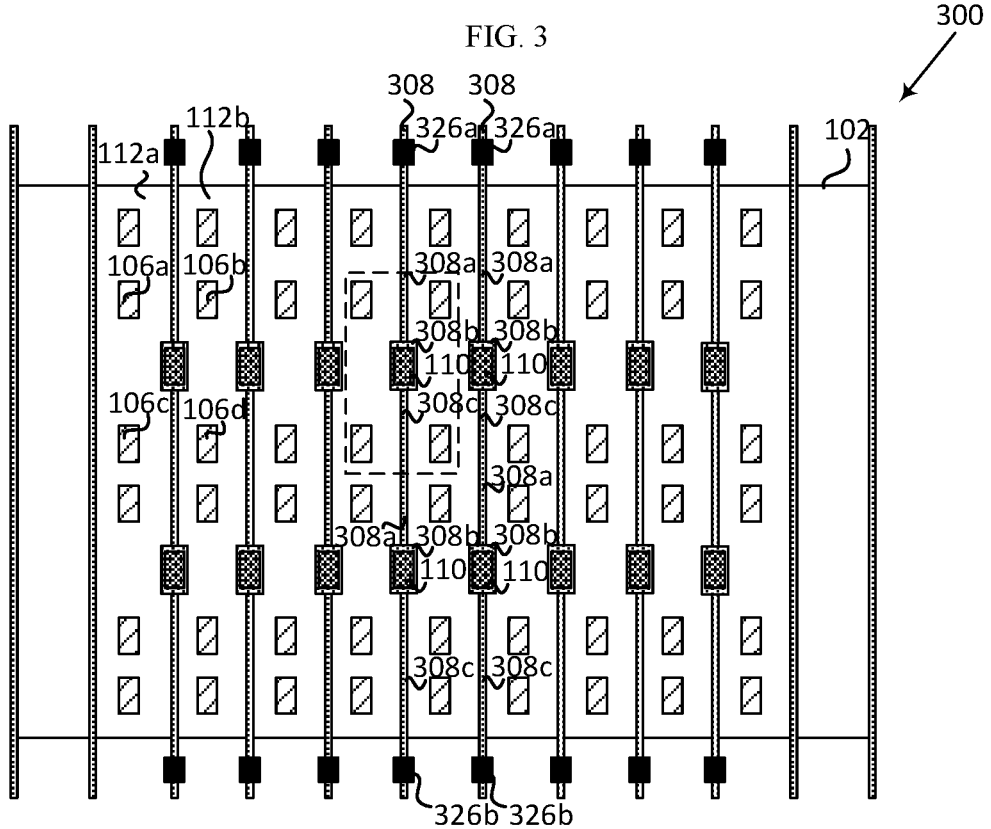
FIG. 4 illustrates a top view of a semiconductor device array, according to yet another embodiment of the disclosure.

FIG. 4 illustrates a top view of a semiconductor device array 300, according to yet another embodiment of the disclosure. In contrast to the semiconductor device array 200 illustrated in FIG. 3, the semiconductor device array 300 may include an array of gates 308 having gate contacts 326a and 326b over an isolation region (not shown). Each gate 308 may have side portions 308a and 308c. Part of the side portions 308a and 308c may extend over the isolation region beyond the active region 102, while another part of the side portions 308a and 308c may extend over the active region 102. The gate contact 326a may be arranged over the side portion 308a and above the isolation region. The gate contact 326b may be arranged over the side portion 308c and above the isolation region. The gate contacts 326a and 326b over the side portions 308a and 308c, respectively, further reduces a gate resistance of the semiconductor device array 300 as an input signal may travel to the gate 308 through both the gate contacts 326a and 326b. For clarity, a unit cell of the gate 308 is indicated by a dashed outline.

Figure 5:
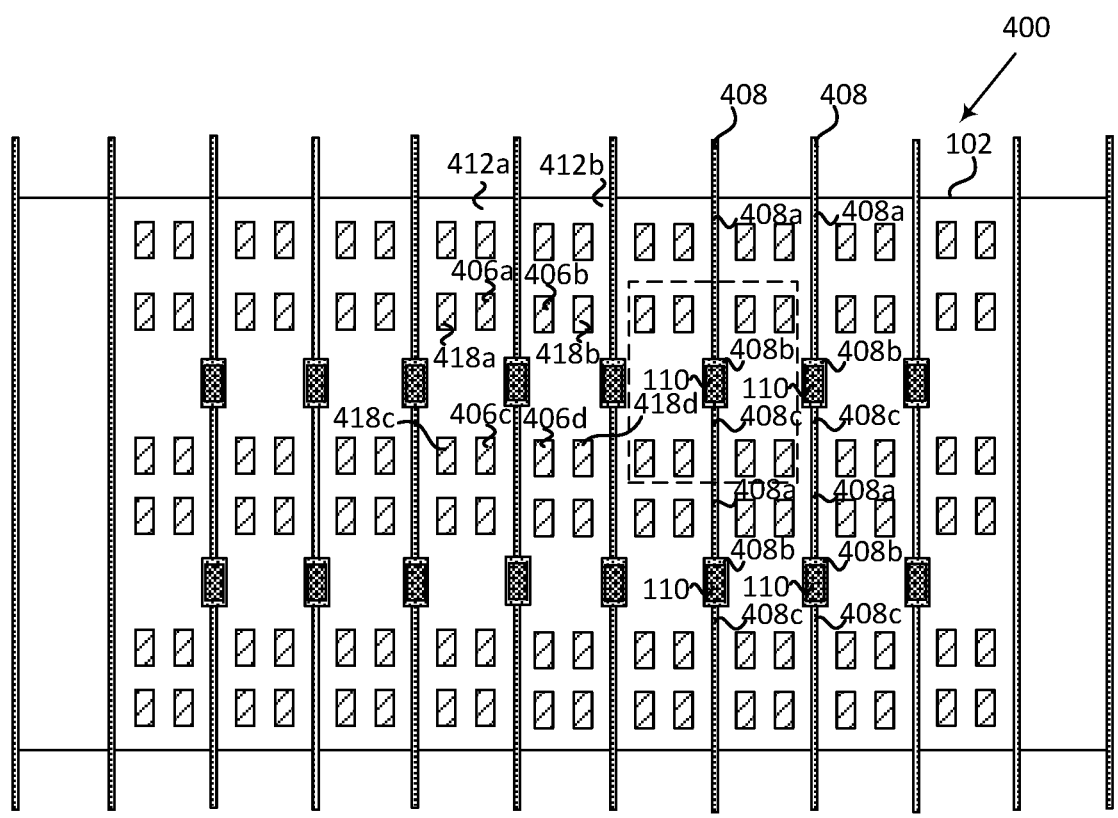
FIG. 5 illustrates a top view of a semiconductor device array, according to yet another embodiment of the disclosure.

FIG. 5 illustrates a top view of a semiconductor device array 400, according to yet another embodiment of the disclosure. In contrast to the semiconductor device array 200 illustrated in FIG. 3, the semiconductor device array 400 may include drain contacts 406b and 418b arranged over a drain 412b and laterally spaced from a side portion 408a of a gate 408. Additionally, source contacts 406a and 418a may be arranged over a source 412a and laterally spaced from the side portion 408a. Drain contacts 406d and 418d may be arranged over the drain 412b and laterally spaced from a side portion 408c of the gate 408. Source contacts 406c and 418c may be arranged over the source 412a and laterally spaced from the side portion 408c. The multiple source contacts 406a, 406c, 418a, and 418c and drain contacts 406b, 406d, 418b, and 418d result in a lower source and drain contact resistance of the device array 400 as compared to device arrays 200 and 300. For clarity, a unit cell of the gate 408 is indicated by a dashed outline.

FIG. 6A illustrates a side view of a partially completed semiconductor device 100 shown in FIG. 1A taken along section line A-A' after formation of the gate dielectric layer 122, the work function metal layer 126, the gate 108 and the spacer structures 116, according to an embodiment of the disclosure. Referring to FIG. 6A, a silicon on insulator (SOI substrate) may be provided. The SOI substrate may include an active region 102 over a first insulator region 120 and a substrate (not shown). The gate dielectric layer 122, the work function metal layer 126, and the gate 108 may subsequently be formed over the active region 102. A layer of a suitable gate dielectric material, for example, silicon dioxide ($SiO_2$), silicon nitride ($Si_3N_4$), a high-k dielectric material, for example, hafnium oxide ($HfO_2$), zirconium oxide ($ZrO_2$), aluminum oxide ($Al_2O_3$), or any other suitable dielectric material may be deposited over the active region 102. A layer of a suitable work function metal, for example, titanium nitride (TiN), tantalum nitride (TaN), or any other suitable metal, may be deposited over the gate dielectric material. A layer of n-doped or p-doped polysilicon may be deposited over the work function metal. The deposition processes may be by chemical vapor deposition (CVD), physical vapor deposition (PVD), atomic layer deposition (ALD), or any other suitable deposition processes. The polysilicon, the work function metal and the gate dielectric material may be patterned by a suitable photolithography process. The photolithography process may include depositing a layer of photoresist over the polysilicon, the work function metal, and the gate dielectric material. The photoresist layer may be exposed and developed to form a suitable photoresist pattern. A wet etch or dry etch process may be used to remove portions of the polysilicon, the work function metal and the gate dielectric material not covered by the photoresist pattern, leaving behind another portion of the polysilicon, the work function metal and the gate dielectric material under the photoresist pattern to form the gate 108, the work function metal layer 126 and the gate dielectric layer 122, respectively. The photoresist pattern may subsequently be removed. The gate 108 includes the side portions 108a and 108c (not shown) and the middle portion 108b. The spacer structures 116 may subsequently be formed at side surfaces of the gate 108. A layer of a suitable dielectric material, for example, silicon dioxide ($SiO_2$), silicon nitride ($Si_3N_4$), silicon oxynitride (SiON), or any other suitable dielectric material, may be deposited over the gate 108 and the active region 102. An anisotropic etching process may be used to pattern the silicon dioxide layer, leaving behind the silicon dioxide layer at the side surfaces of the gate 108 thereby forming the spacer structures 116. The term "anisotropic etching" may refer to an etching process that is directional in nature.

FIG. 6B illustrates a side view of a partially completed semiconductor device 100 shown in FIG. 1A taken along section line A-A' after formation of the source 112a and the drain 112b, according to an embodiment of the disclosure. FIG. 6B follows FIG. 6A. Referring to FIG. 6B, the source 112a and the drain 112b may be formed over the active region 102 and adjacent to the spacer structures 116. The source 112a and the drain 112b may be formed by epitaxial growth of a suitable semiconductor material, for example, silicon phosphorus (SiP), silicon germanium (SiGe), or any other suitable semiconductor material. Although not shown, an interlayer dielectric layer (ILD) may be formed over the source 112a, the drain 112b, the gate 108 and the spacer structures 116. The interlayer dielectric layer may be made of tetraethyl orthosilicate or TEOS.

The process may continue to form the device 100 shown in FIG. 1A. Referring to FIG. 1A, openings may be made in the interlayer dielectric layer (not shown) to form source and drain contacts. For example, openings in the interlayer dielectric layer exposes portions of the source 112a and the drain 112b laterally spaced from the side portions 108a and 108c. The formation of the openings may include patterning the interlayer dielectric layer by a suitable photolithography process followed by a wet or dry etch. A suitable metal, for example, tungsten, may be deposited in the openings and subsequently planarized by a suitable planarization process, for example, chemical mechanical planarization, to form the source contacts 106a and 106c and drain contacts 106b and 106d. Another opening may subsequently be made in the interlayer dielectric layer to expose the middle portion 108b. A suitable metal, for example, tungsten, or any other suitable metal, may be deposited in the opening above the middle portion 108b followed by planarization to form the gate contact 110 over the middle portion 108b.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A semiconductor device comprising:
   an active region;
   a gate extending in a first direction over the active region and having side portions and a middle portion between the side portions along the first direction, the side portions and the middle portion are ordered as side portion, middle portion, and side portion in the first direction, wherein the side portions and the middle portion are over the active region, the side portions and the middle portion each has a thickness extending from a first side surface of the gate to a second side surface opposite to the first side surface in a second direction, wherein the second direction is perpendicular to the first direction, and the thickness of the middle portion is wider than the thickness of the side portions in the second direction; and
   a first gate contact over the middle portion.

2. The semiconductor device of claim 1, wherein the middle portion is horizontally wider than the first gate contact.

3. The semiconductor device of claim 1, further comprising:
   source and drain contacts over the active region, wherein the source and drain contacts are laterally spaced from the side portions of the gate.

4. The semiconductor device of claim 1, further comprising:
   a source over the active region, the source having a top surface;
   a drain over the active region, the drain having a top surface; and
   the top surface of the source and the top surface of the drain are higher than a top surface of the active region.

5. The semiconductor device of claim 4, further comprising:
   spacer structures separating the gate from the source and the drain.

6. The semiconductor device of claim 1, wherein a length of each of the side portions of the gate over the active region is at least one point seven (1.7) times a length of the middle portion.

7. The semiconductor device of claim 1, wherein the middle portion is at least one point two (1.2) times horizontally wider than the first gate contact.

8. The semiconductor device of claim 7, wherein the middle portion is at least one point three (1.3) times vertically longer than the first gate contact.

9. The semiconductor device of claim 1, wherein the active region is arranged over a first insulator region and the first insulator region is over a substrate.

10. The semiconductor device of claim 1, further comprising:
    an isolation region adjacent to the active region, wherein the side portions of the gate extend over the isolation region.

11. The semiconductor device of claim 10, further comprising:
    a second gate contact over each of the side portions of the gate over the isolation region.

12. The semiconductor device of claim 1, wherein end segments of the side portions of the gate are over the active region.

13. The semiconductor device of claim 1, wherein the gate extends lengthwise in the first direction and the second direction is along a width of the gate.

14. A semiconductor device comprising:
    an active region;
    a gate having side portions and a middle portion, the middle portion is arranged between the side portions, wherein the side portions and the middle portion are over the active region, and the middle portion is horizontally wider than the side portions;
a first gate contact over the middle portion; and
source and drain contacts over the active region, wherein the source and drain contacts are diagonally spaced from the middle portion of the gate.

15. The semiconductor device of claim 14, wherein the source and drain contacts are diagonally spaced from the first gate contact.

16. A semiconductor device comprising:
an active region;
a gate having a plurality of side portions and middle portions, wherein the side portions and the middle portions are over the active region, each of the middle portions is arranged between two of the side portions, and the middle portions are horizontally wider than the side portions; and
a gate contact over each of the middle portions, wherein each of the middle portions is at least one point two (1.2) times horizontally wider than the gate contact.

17. The semiconductor device of claim 16, further comprising:
a source over the active region, the source having a top surface;
a drain over the active region, the drain having a top surface; and
the top surface of the source and the top surface of the drain are higher than a top surface of the active region.

18. A method of fabricating a semiconductor device comprising:
forming a gate over an active region, the gate extending in a first direction over the active region and having side portions and a middle portion between the side portions along the first direction, the side portions and the middle portion are ordered as side portion, middle portion, and side portion in the first direction, wherein the side portions and the middle portion are over the active region, the side portions and the middle portion each has a thickness extending from a first side surface of the gate to a second side surface opposite to the first side surface in a second direction, wherein the second direction is perpendicular to the first direction, and the thickness of the middle portion is horizontally wider than the thickness of the side portions in the second direction; and
forming a first gate contact over the middle portion.

19. The method of claim 18, wherein forming the gate further comprises:
forming a layer of polysilicon over the active region;
patterning the polysilicon layer to form the side portions and the middle portion of the gate over the active region; and
forming spacer structures at the first and second side surfaces of the gate.

20. The method of claim 19, further comprising:
forming an epitaxial source and an epitaxial drain over the active region, adjacent the spacer structures; and
forming source and drain contacts over the epitaxial source and the epitaxial drain, wherein the source and drain contacts are diagonally spaced from the middle portion of the gate.

* * * * *